(12) United States Patent
Osari

(10) Patent No.: US 6,327,179 B1
(45) Date of Patent: Dec. 4, 2001

(54) SEMICONDUCTOR MEMORY DEVICE AND METHOD FOR PRODUCING SAME

(75) Inventor: Kanji Osari, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,815

(22) Filed: Jun. 28, 2000

(30) Foreign Application Priority Data

Jun. 29, 1999 (JP) .................................................. 11-184362

(51) Int. Cl.[7] .................................................. G11C 13/00
(52) U.S. Cl. .......................... 365/185.05; 365/51; 365/63
(58) Field of Search ................................ 365/185.05, 51, 365/63, 149

(56) References Cited

U.S. PATENT DOCUMENTS 5,298,775 * 3/1994 Ohya ...................................... 365/149

* cited by examiner

Primary Examiner—Terrell W. Fears
(74) Attorney, Agent, or Firm—Oblon, Spivak, McClelland, Maier & Neustadt, P.C.

(57) ABSTRACT

There is provided a semiconductor memory device using a three-layer gate electrode material film to improve yields and reliability, and a method for producing the same. A floating gate 4 of a memory transistor MT is formed of a first-layer gate electrode material film L1, and a control gate 6 is formed of a laminated film of second-layer and third-layer gate electrode material films L2 and L3. A gate electrode 8 of a selecting gate transistor ST is formed of the first-layer gate electrode material film L1, and the second-layer and third-layer gate electrode material films L2 and L3 which are stacked thereon via an interlayer dielectric film 5. The third-layer gate electrode material film L3 contacts the first-layer gate electrode material film L1 via an opening 9. A gate electrode 12 of a peripheral circuit transistor Q is formed of the laminated film of the second-layer and third-layer gate electrode material films L2 and L3.

5 Claims, 13 Drawing Sheets

SEMICONDUCTOR MEMORY DEVICE AND METHOD FOR PRODUCING SAME

BACKGROUND OF THE INVENTION

1. Field of the Invention

The present invention relates generally to a semiconductor memory device having electrically rewritable nonvolatile memory cells having two-layer gate structure, and a method for producing the same. More specifically, the invention relates to the improvement of a process when peripheral circuits, such as logic circuits, are consolidated into a semiconductor memory device.

2. Related Background Art

A typical memory transistor of a nonvolatile semiconductor memory, such as an EEPROM, has a floating gate, which is formed on a semiconductor substrate via a gate insulating film, and a control gate which is formed on the floating gate film via an insulating film. The memory transistor is combined with a selecting gate transistor to constitute a memory cell. In this case, the gate electrode of the selecting gate transistor is formed of the same gate electrode material film as that of the floating gate of the memory cell. In addition, when logic circuits, together with nonvolatile memory cells, are integrated to be formed, the gates of logic circuit transistors are formed of the same gate electrode material film as those of the control gates of the memory cells.

The semiconductor substrate, on which the memory cells and the logic circuit transistors have been formed, is covered with an interlayer dielectric film, and a metal wiring is formed thereon. The planarization of the interlayer dielectric film underlying the wiring is indispensable to the fine patterning of the wiring. In particular, when the wiring is formed in multilayer, the planarization of the interlayer dielectric film is indispensable. In recent years, the CMP (Chemical Mechanical Polishing) technique is often used for carrying out the planarization of the interlayer dielectric film.

When the planarization of the interlayer dielectric film is carried out by the CMP process, it is desired that the difference between the level of the two-layer gate structure portion of a memory cell array region and the level of the one-layer gate structure portion of a logic circuit is smaller from the point of view of the margin of contact and the prevention of short-circuit accident. In order to achieve this, it is considered that the first-layer gate electrode material film of the memory transistor and selecting gate transistor is thinned.

However, if the first-layer gate electrode material film is thin, the contact of the metal wiring easily goes through the gate electrode of the selecting gate transistor which is formed of the first-layer gate electrode material film. This causes the deterioration of yields and the deterioration of reliability due to the contact failure of the metal wiring to the selecting gate transistor.

SUMMARY OF THE INVENTION

It is therefore an object of the present invention to eliminate the aforementioned problems and to provide a semiconductor memory device capable of improving yields and reliability using a three-layer gate electrode material film, and a method for producing the same.

In order to accomplish the aforementioned and other objects, according to one aspect of the present invention, there is provided a semiconductor memory device comprising a memory cell array having arranged memory transistors and selecting gate transistors of nonvolatile memory cells, each the memory transistor and each the selecting gate transistor having a first-layer gate electrode material film, which is formed on a semiconductor substrate via a gate insulating film, and second-layer and third-layer gate electrode material films which are stacked on the first-layer gate electrode material film via an interlayer dielectric film, each the memory transistor having a floating gate, which is formed of the first-layer electrode material film, and a control gate which is formed of a laminated film of the second-layer and third-layer gate electrode material films, and each the selecting gate transistor having a gate electrode which is formed of the first-layer to third-layer electrode material films while the third-layer gate electrode material film contacts the first-layer gate electrode material film via an opening which is formed in the second-layer gate electrode material film and the interlayer insulating film.

According to another aspect of the present invention, there is provided a method for producing a semiconductor memory device wherein a memory cell array and a peripheral circuit are integrated on a semiconductor substrate, the method comprising:

a first step of depositing a first-layer gate electrode material film on the semiconductor substrate via a first gate insulating film;

a second step of depositing an interlayer dielectric insulating film on said first-layer gate electrode material film;

a third step of etching and removing the interlayer insulating film and said first-layer gate electrode material film on the semiconductor substrate in a peripheral circuit forming region;

a fourth step of forming a second gate insulating film on the semiconductor substrate in the peripheral circuit forming region;

a fifth step of depositing a second-layer gate electrode material film on the interlayer insulating film and the second gate insulating film;

a sixth step of forming an opening which passes through the second-layer gate electrode material film and the interlayer insulating film to the first-layer gate electrode material film, in a selecting gate transistor region of the memory cell array;

a seventh step of depositing a third-layer gate electrode material film so as to be stacked on the second-layer gate electrode material film; and an eighth step of sequentially etching the third-layer gate electrode material film, the second-layer gate electrode material film, the interlayer insulating film and the first-layer gate electrode material film, to form memory transistors and selecting gate transistors in the memory cell array region, each the memory transistor has a floating gate of the first-layer gate electrode material film and a control gate of a laminated film of the second-layer and third-layer gate electrode material films, each the selecting gate transistor having a first gate electrode wherein the third-layer gate electrode material film contacts the first-layer gate electrode material film via the opening, and to form transistors in the peripheral circuit forming region each of which transistor has a second gate electrode of the laminated film of the second-layer and third-layer gate electrode material films.

According to the present invention, the gate electrode of the selecting gate transistor is formed by patterning the first-layer gate electrode material film and the third-layer gate electrode material film contacting therewith. Therefore, even if the first-layer gate electrode material film is thin, it is possible to surely prevent the metal wiring from going through the gate electrode of the selecting gate transistor at the step of bringing the metal wiring into contact with the gate electrode of the selecting gate transistor, so that it is possible to improve yields and reliability.

In addition, the control gate of the memory transistor is formed of the laminated film of the second-layer and third-layer gate electrode material films, and the gate electrode of the peripheral circuit transistor is also formed of the laminated film of the second-layer and third-layer gate electrode material films. Therefore, by thinning the first-layer gate electrode material film, it is possible to decrease the difference between the levels of the gate portions of the memory transistor and the peripheral transistor, so that it is possible to easily carry out the planarization of the interlayer dielectric film before forming the metal wiring.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

(First Preferred Embodiment)

Figure 1:
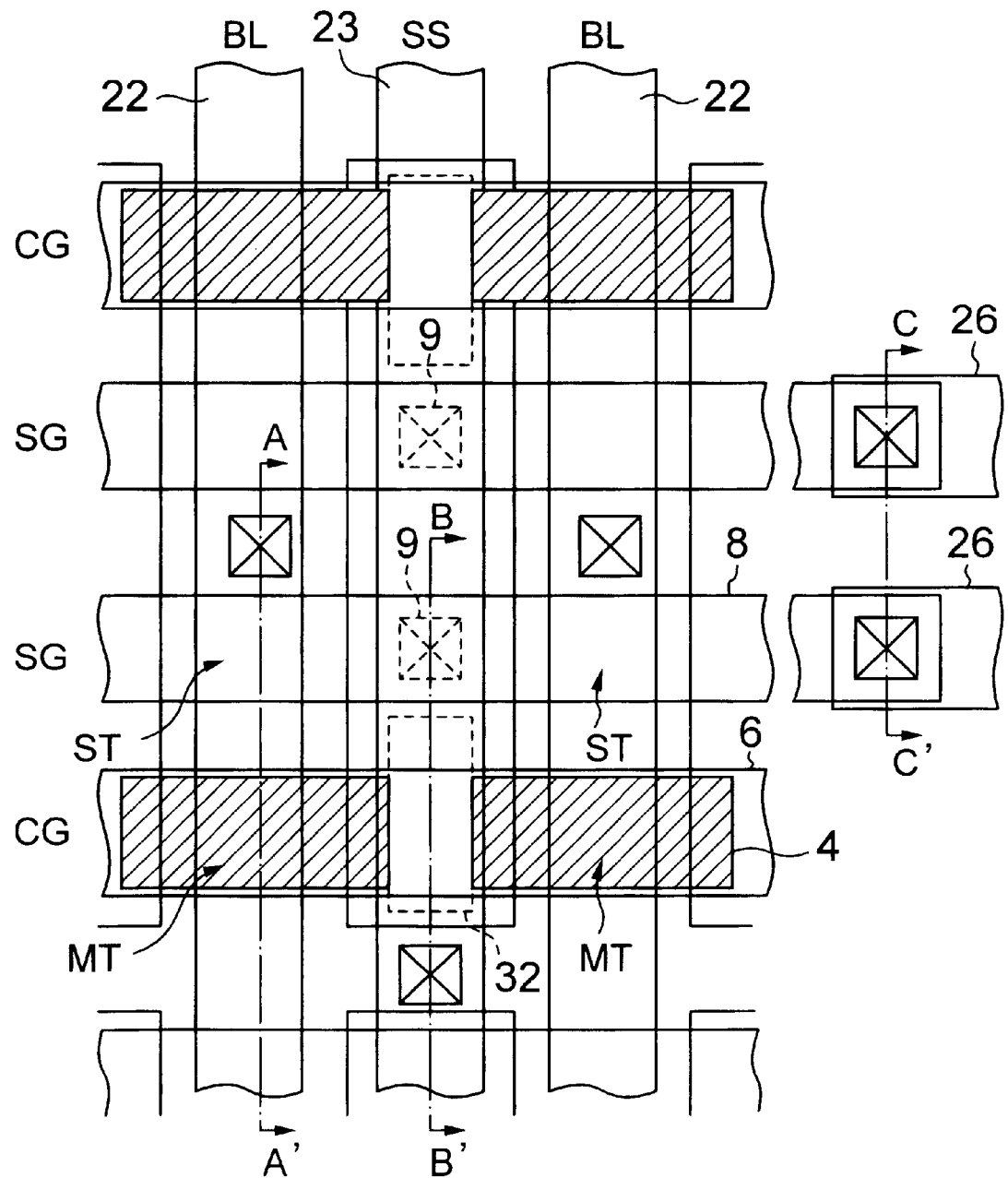
FIG. 1 is a layout drawing of a memory cell array region of a preferred embodiment of an EEPROM according to the present invention.
Figure 2:
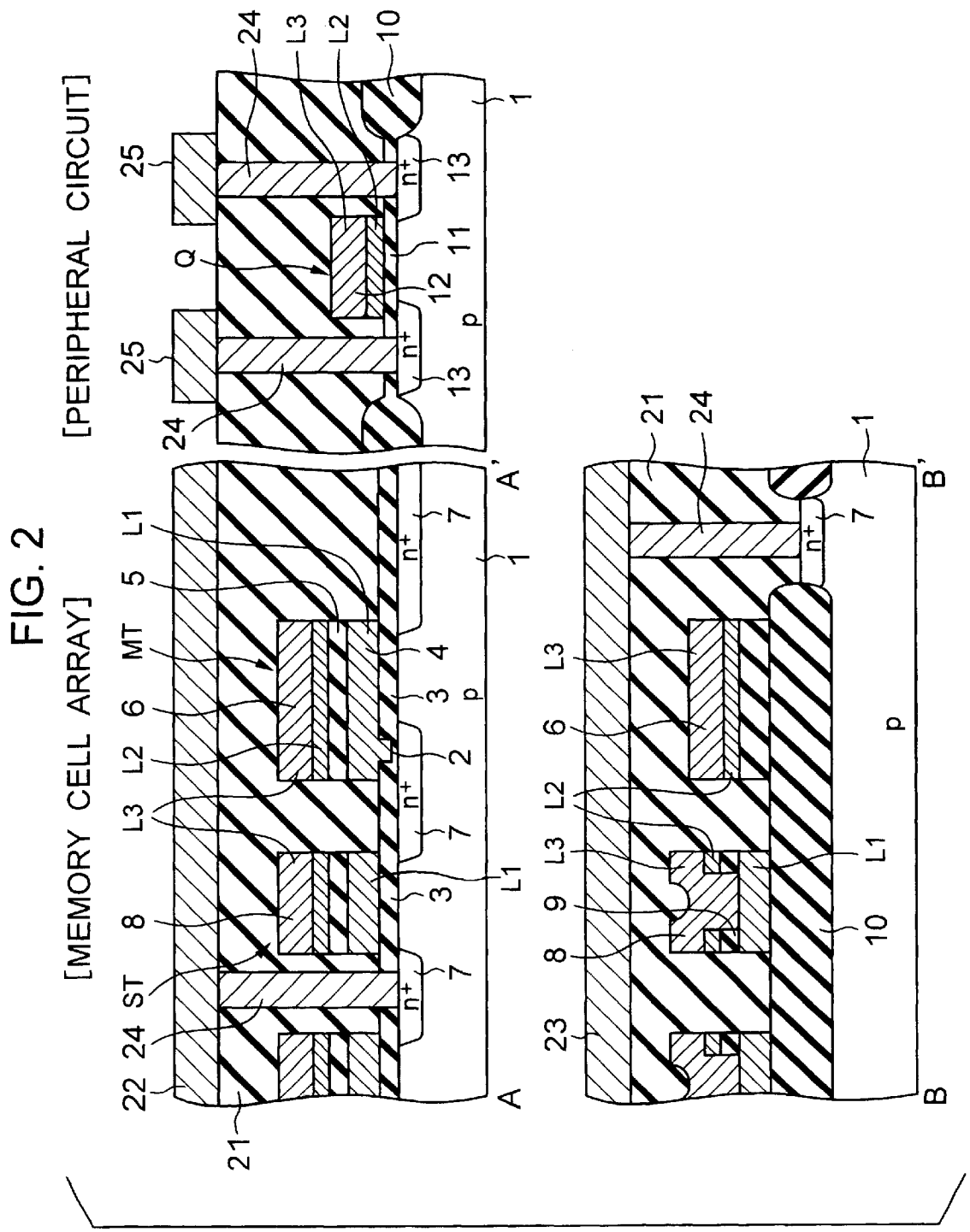
FIG. 2 is a sectional view of a transistor region of a peripheral circuit, which show cross sections taken along lines A–A' and B–B' of FIG. 1.

FIG. 1 shows the layout of a memory cell array region of a preferred embodiment of an EEPROM according to the present invention, and FIG. 2 shows cross sections of the memory cell array region taken along lines A–A' and B–B' of FIG. 1, together with a cross section of a peripheral circuit transistor part.

In a memory cell array region, memory cells, each of which comprises a memory transistor MT and a selecting gate transistor ST, are arranged in regions which are formed by dividing a silicon substrate 1 by an element isolating insulator film 10. The memory transistor MT comprises: a floating gate 4 which is formed on the silicon substrate 1 via a gate insulating film 3; a control gate 6 which is formed on the floating gate 4 via an interlayer dielectric film 5; and n$^+$-type diffusion layers 7 which are formed in the semiconductor substrate 1 to serve as a source and a drain. In the gate insulating layer 3, a rewriting region 2 of a tunnel insulating film tunnel insulating film portion is formed. The floating gate 4 is formed of a first-layer gate electrode material film L1, and the control gate 6 is formed of a laminated film comprising a second-layer gate electrode material film L2 and a third-layer gate electrode material film L3.

The gate electrode 7 of the selecting gate transistor ST is formed of the three-layer gate electrode material films L1 through L3 similar to the memory transistor MT. In this preferred embodiment, the third-layer gate electrode material film L3 of the gate electrode 7 of the selecting gate transistor ST contacts the first-layer gate electrode material film L1 via an opening 9, which is formed in the second-layer gate electrode material film L2 so as to pass through the interlayer dielectric film 5, in an element isolating region as shown by the sectional view taken along line B–B'.

The floating gate 4 of the memory transistor MT is separated every memory cell to be patterned as shown by slanting lines in FIG. 1. The control gate 6 is continuously formed so as to extend in one direction over a plurality of memory cells as shown in FIG. 1, to serve as a control gate line CG. The gate electrode 8 of the selecting gate transistor ST is also continuously patterned similar to the control gate line CG, to serve as a selecting gate line SG.

The transistor Q of a peripheral circuit has a gate electrode 12 which is formed via a gate insulating film 11, and n$^+$-diffusion layers 13 serving as a source and a drain. The gate electrode 12 is patterned by a laminated film comprising the second-layer and third-layer gate electrode material films L2 and L3 of the three-layer gate electrode material films L1 through L3 in the memory cell array region. Although typical one of NMOS transistors of a peripheral circuit is shown, a PMOS transistor also has the same gate structure when the peripheral circuit has the CMOS structure.

The substrate, on which the memory cells and peripheral circuit transistors are formed, is covered with an interlayer dielectric film 21, on which metal wirings, such as bit lines (BL) 22, source lines (SS) 23 and signal lines 25 of the peripheral circuit, are formed. The interlayer insulating film 21 is flattened by the CMP processing. In addition, contact plugs 24 are embedded into the wiring connecting portion of the interlayer insulating film 21. The metal wirings 22, 23 and 25 are connected to the diffusion layer via the contact plugs 24.

Figure 3:
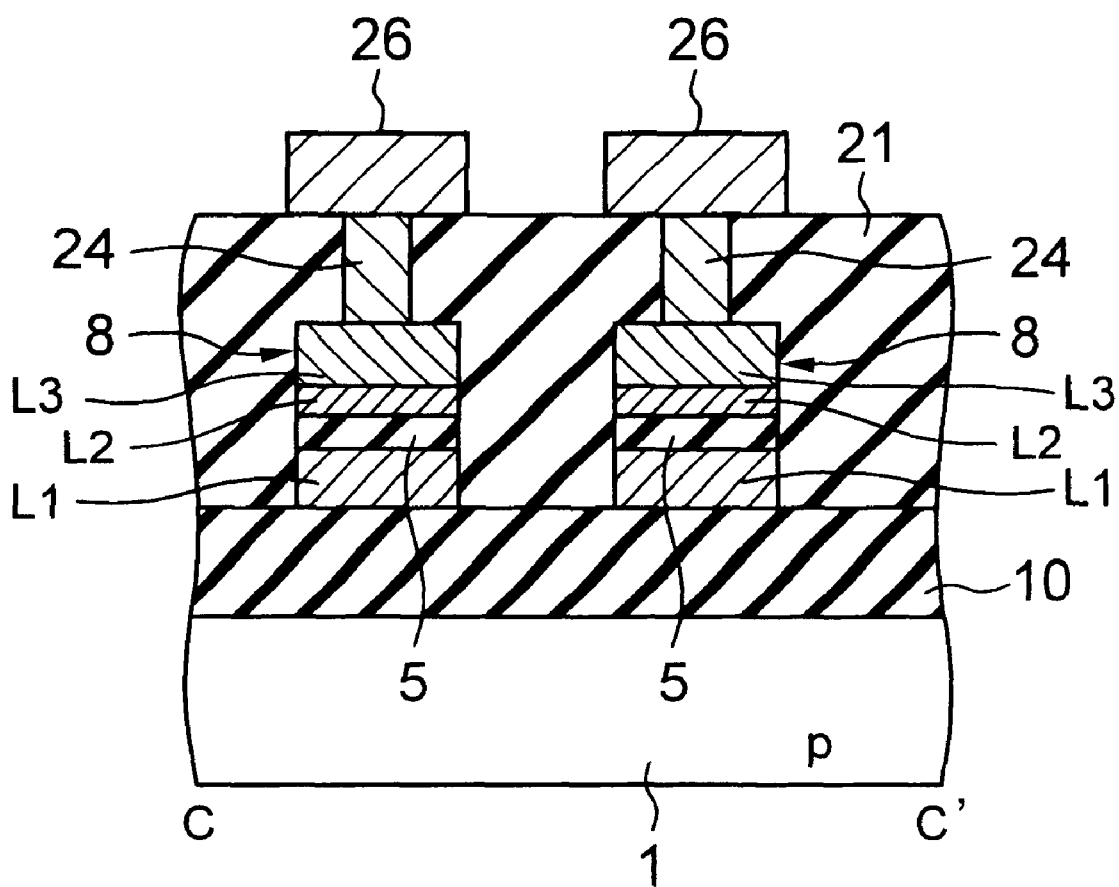
FIG. 3 is a sectional view taken along line C–C' of FIG. 1.

FIG. 3 shows the sectional structure of contact portions of metal wirings 26 which contact the selecting gate line SG in place, i.e., the cross section taken along line C–C' of FIG. 1. As described above, the gate electrode 8 serving as the selecting gate line SG is patterned by the three-layer gate electrode material films L1 through L3, and the metal wirings 26 contact the uppermost-layer gate electrode material film L3.

Referring to FIGS. 4 through 9 which are sectional views corresponding to FIG. 2, a concrete producing process in this preferred embodiment will be described below.

Figure 4:
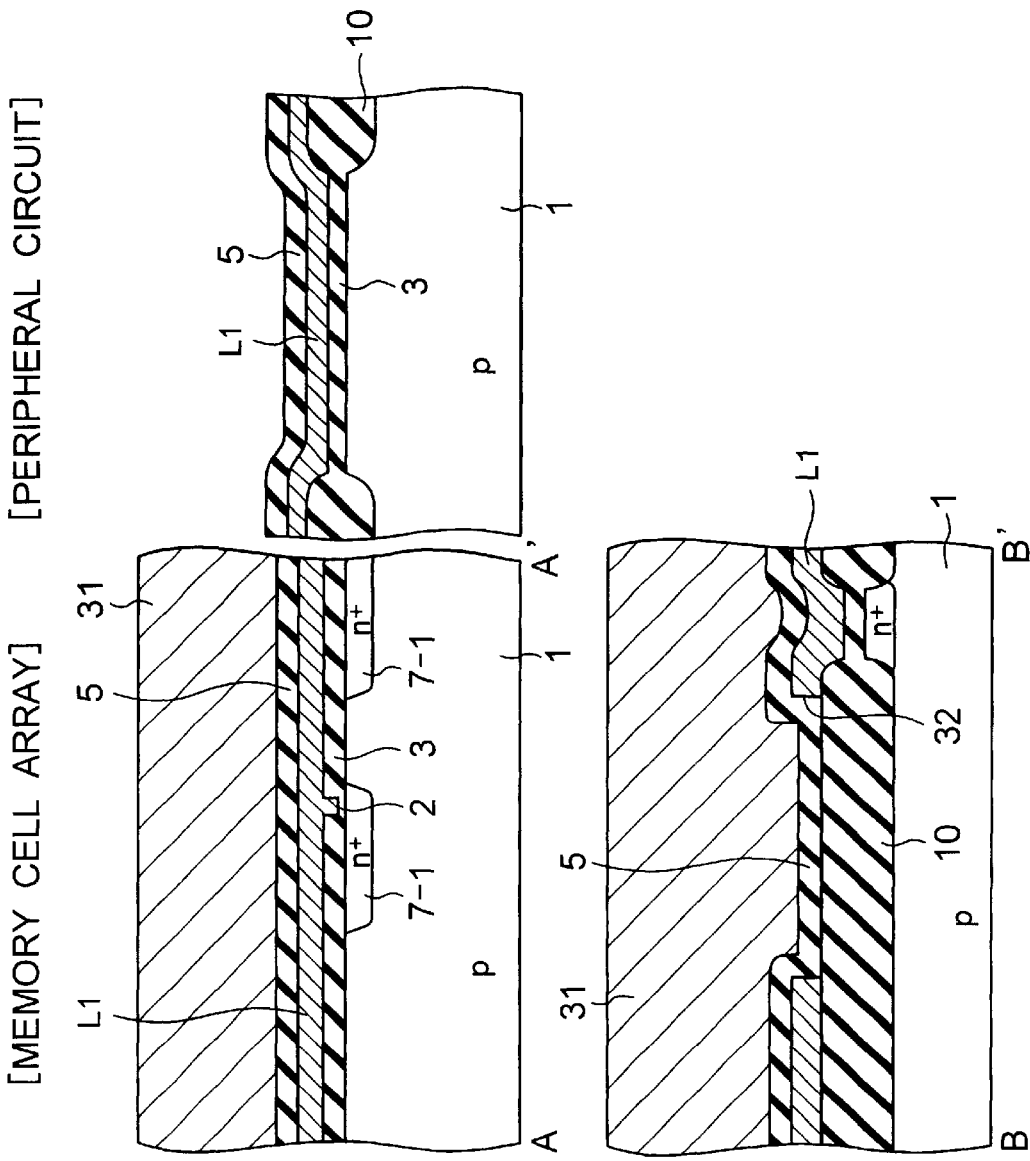
FIG. 4 is a sectional view showing a step of depositing a first-layer gate electrode material film in the preferred embodiment.

As shown in FIG. 4, an element isolating insulator film 10 is formed in a silicon substrate 1 by the LOCOS method or the embedding method. Thereafter, $n^+$-type diffusion layers 7-1 are previously formed in the source and drain regions of a memory transistor MT. Subsequently, a gate insulating film 3 is formed. Of the gate insulating film 3, in a rewriting region 2 of the memory transistor MT, a window is formed to form a thin tunnel insulating film.

Then, a polycrystalline silicon film is deposited as a first-layer gate electrode material film L1 which is used for forming the floating gate of the memory transistor MT. In the first-layer gate electrode material film L1, a cell slit 32 for separating the floating gate is formed on the element isolating region between adjacent memory transistors in the memory cell array region.

Figure 5:
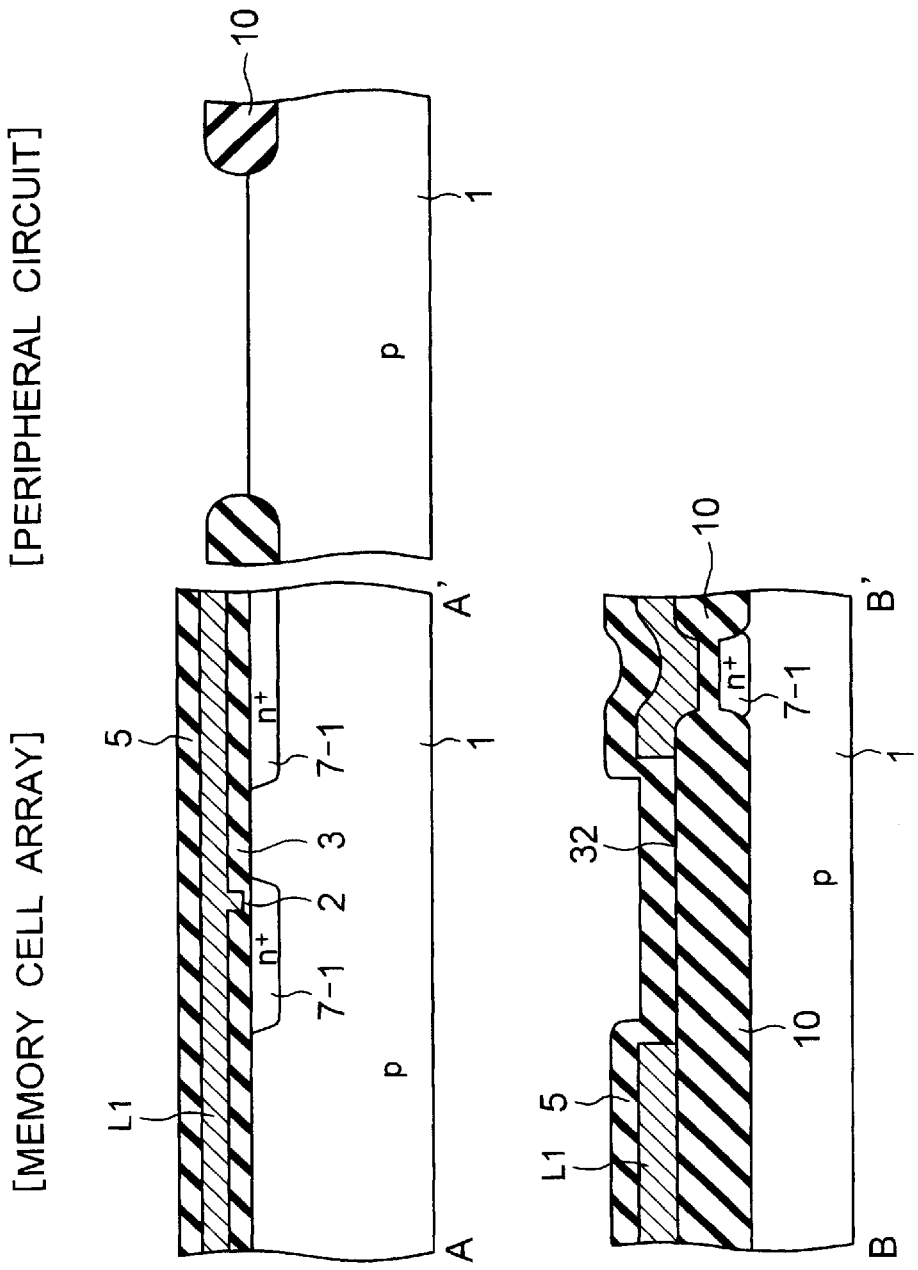
FIG. 5 is a sectional view showing a step of processing the first-layer gate electrode film in the preferred embodiment.

Then, an interlayer dielectric film 5 is deposited. Thereafter, a resist pattern 31 for covering the memory cell array region is formed, and then, as shown in FIG. 5, the interlayer dielectric film 5, the first-layer gate electrode material film L1 and the gate insulating film 3 in the peripheral circuit region are sequentially etched to be removed.

Figure 6:
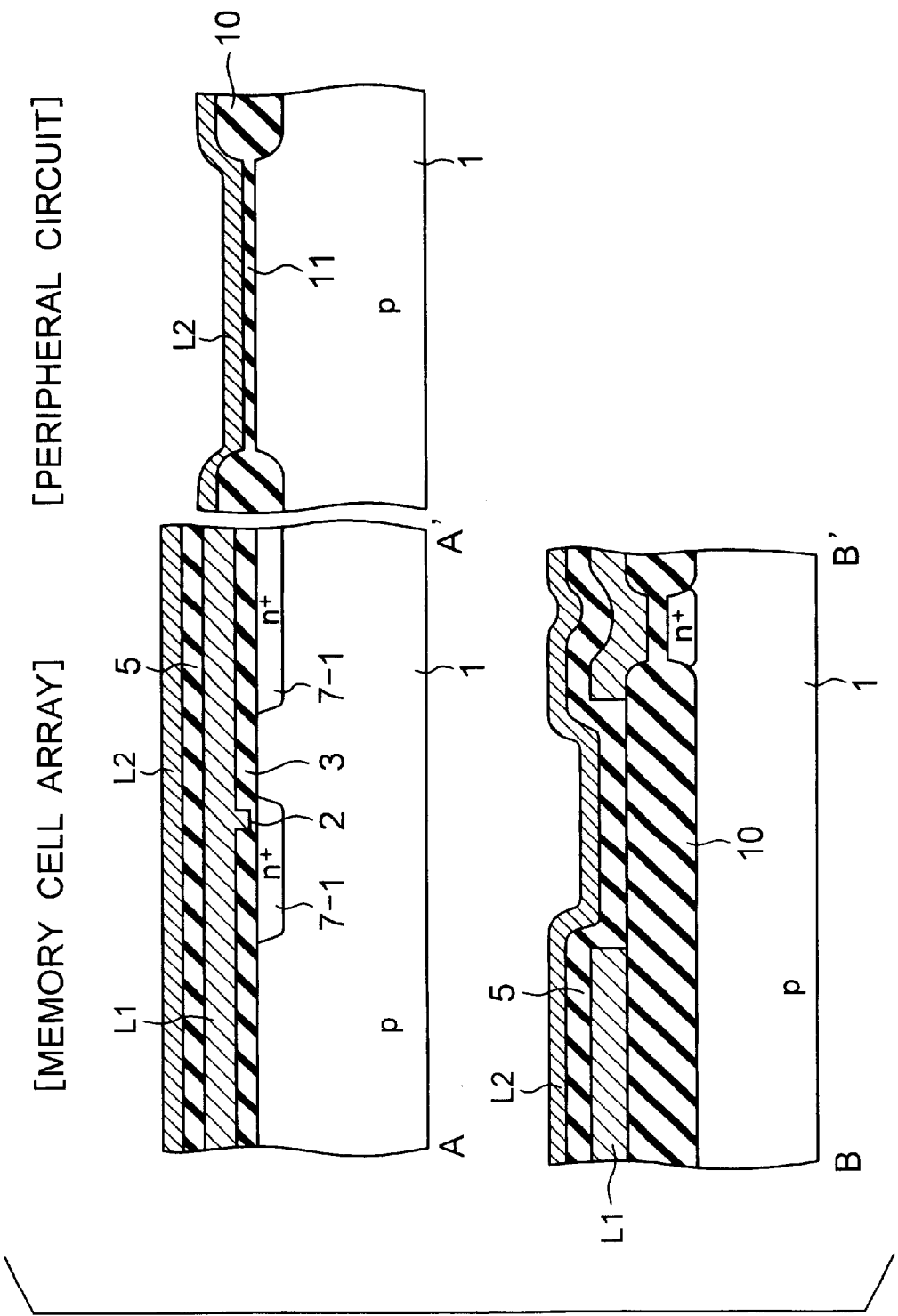
FIG. 6 is a sectional view showing a step of depositing a second-layer gate electrode film in the preferred embodiment.

Then, as shown in FIG. 6, after a gate insulating film 11 is formed on the silicon substrate 10 having the exposed peripheral circuit region, a thin polycrystalline silicon film is deposited on the whole surface as a second-layer gate electrode material film L2. The second-layer gate electrode material film L2 is associated with a third-layer gate electrode material film L3, which is stacked thereon, to form a selecting gate transistor MT, a gate electrode of a peripheral circuit transistor Q, and a control gate of a memory transistor MT. However, before the third-layer gate electrode material film L3 is deposited, it is required to carry out a process for forming an opening for allowing the third-layer gate electrode material film L3 to contact the first-layer gate electrode material film L1 in the selecting gate transistor region.

Figure 7:
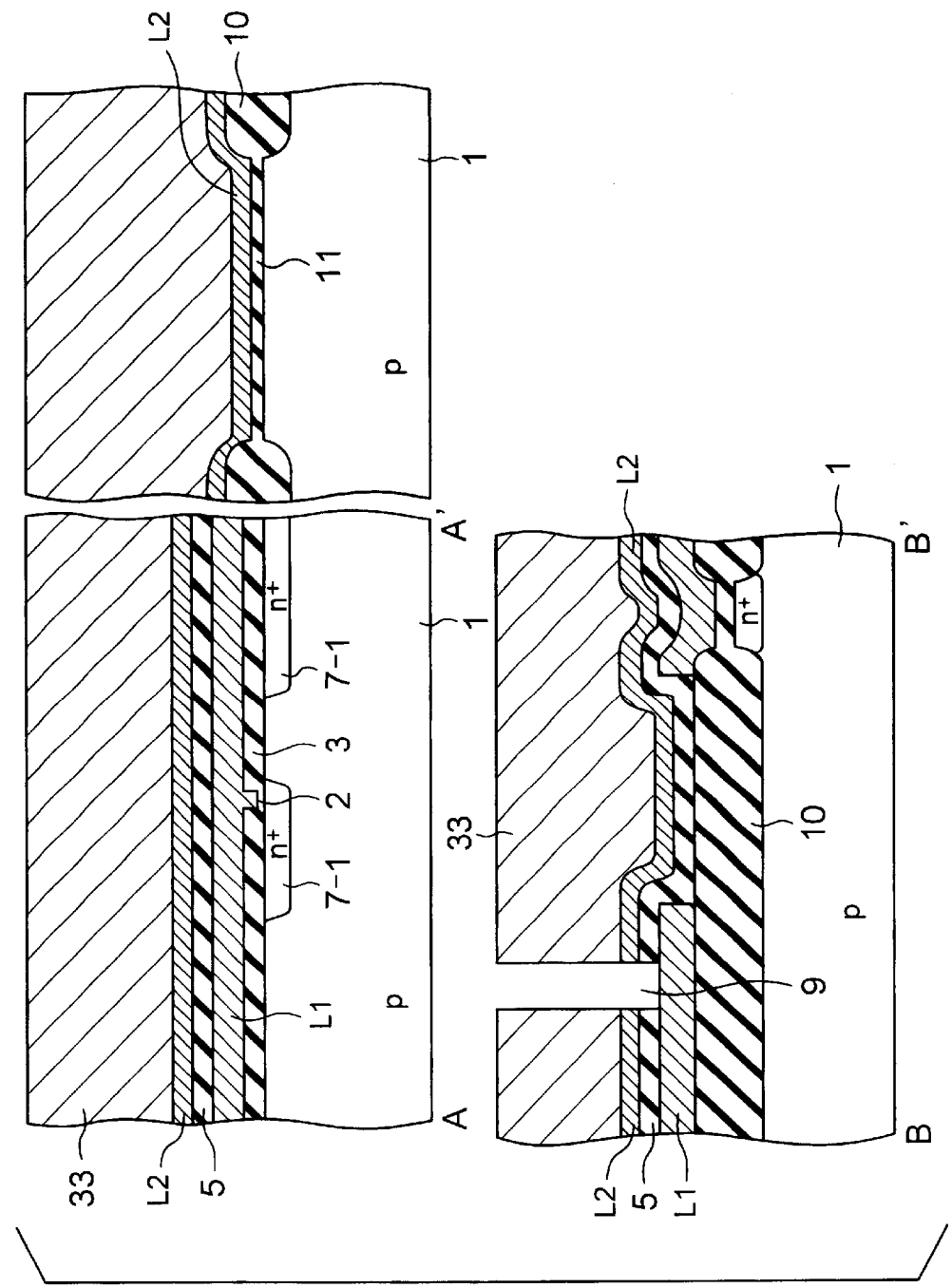
FIG. 7 is sectional view showing a step of forming a contact hole in the first-layer gate electrode material film in the preferred embodiment.

FIG. 7 shows a step of forming an opening for allowing the above described third-layer gate electrode material film L3 to contact the first-layer gate electrode material film L1 in the region of the selecting gate transistor ST. As shown in this figure, a resist pattern 33 having a window is formed on the element isolating region between adjacent selecting gate transistors, and the second-layer gate electrode material film L2 and the underlying interlayer dielectric film 5 are etched to form the opening 9.

Figure 8:
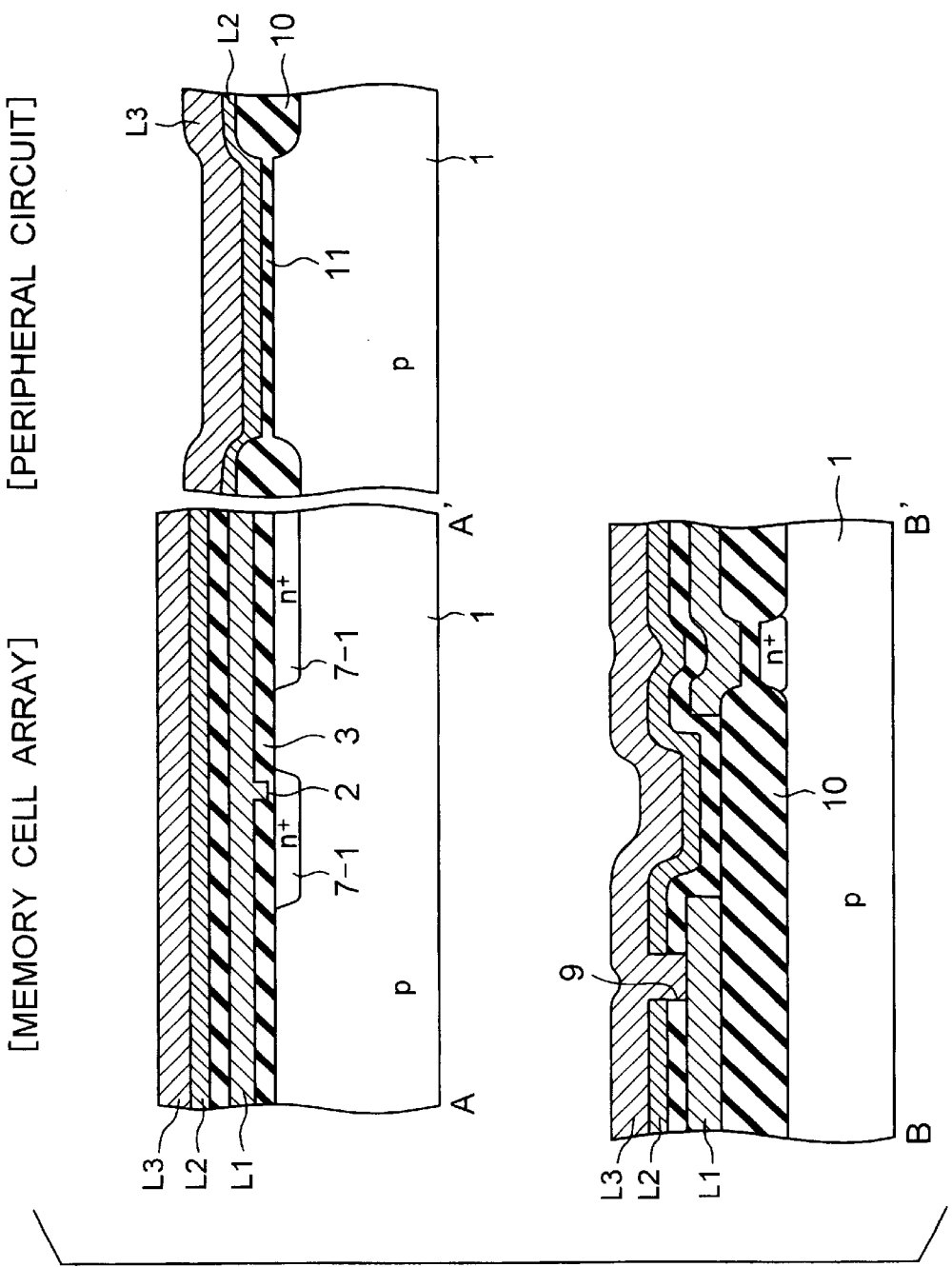
FIG. 8 is a sectional view showing a step of depositing a second layer and a second-layer gate electrode material film in the preferred embodiment.

Then, after the resist pattern 33 is removed, a polycrystalline silicon film is deposited as the third-layer gate electrode material film L3 as shown in FIG. 8. The third-layer gate electrode material film L3 serves as a major part of a gate electrode, and is far thicker than the second-layer gate electrode material film L2.

Figure 9:
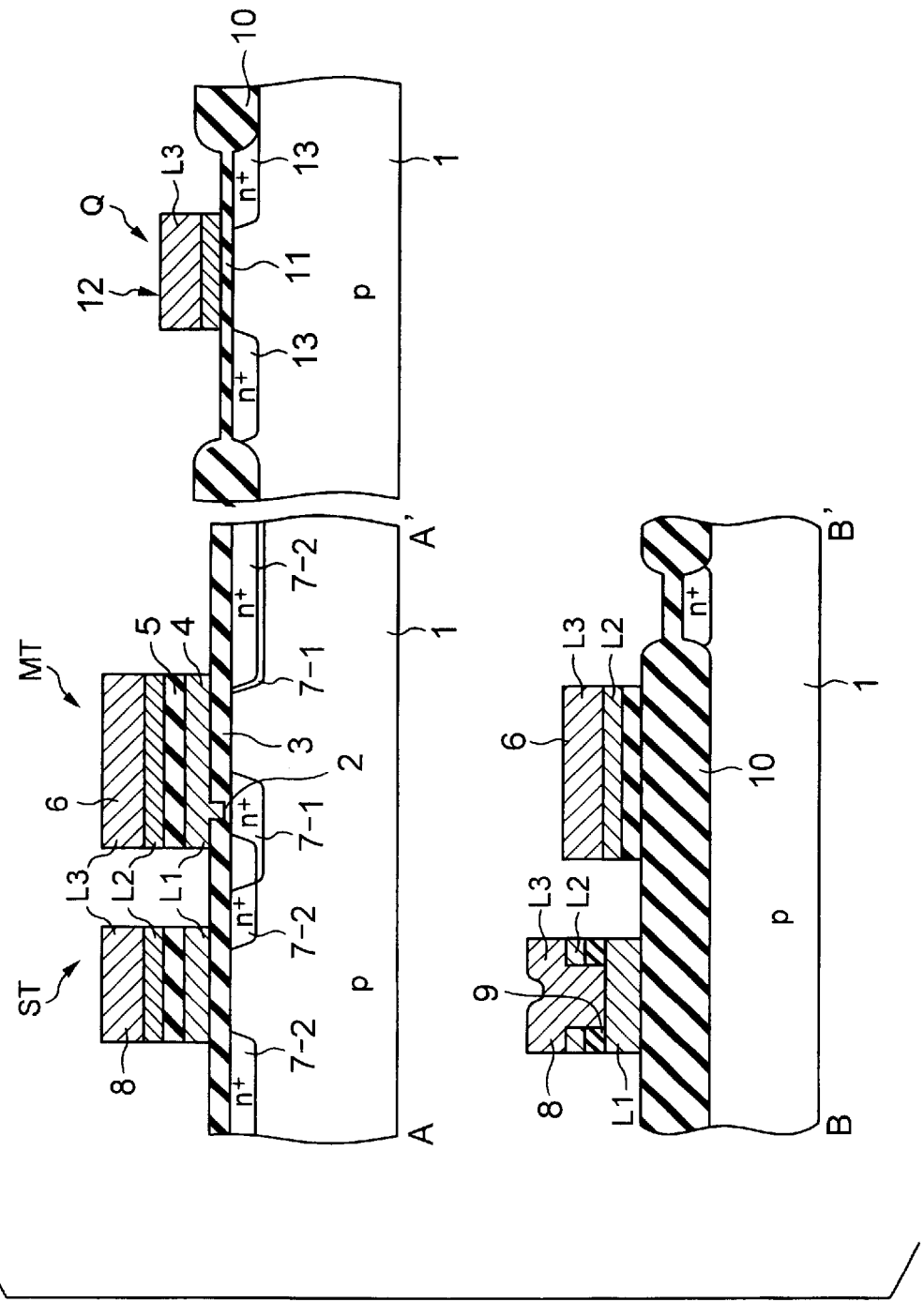
FIG. 9 is a sectional view showing a step of processing a gate electrode in the preferred embodiment.

Thereafter, a resist pattern (not shown) for processing a gate is formed to etch the third-layer gate electrode material film L3 and the second-layer gate electrode material film L2, and to further etch the interlayer dielectric film 5. Subsequently, the first-layer gate electrode material film L1 is etched to form a gate electrode 8 of a selecting gate transistor ST, a control gate 6 of a memory transistor MT, and a gate electrode 12 of a peripheral circuit transistor Q as shown in FIG. 9.

As shown in this figure, in the selecting gate transistor ST, the third-layer gate electrode material film L3 contacts the first gate electrode material film L1 in the element isolating region to form the gate electrode 8 having a three-layer structure. In the memory transistor MT, the control gate 6 is formed by the laminated structure of the second-layer and third-layer gate electrode material films L2 and L3. Similarly, in the peripheral circuit transistor Q, the gate electrode 12 is formed by the laminated structure of the second-layer and third-layer gate electrode material films L2 and L3.

Thereafter, in the memory cell array region, $n^+$-type diffusion layers 7-1 are formed while being self-aligned to the gate electrodes 8 and the control gates 6. Simultaneously, in the peripheral circuit transistor Q region, $n^+$-type diffusion layers 13 serving as a source and a drain are formed.

Thereafter, as shown in FIG. 2, an interlayer dielectric film 21 is deposited to be flattened by the CMP. Then, contact plugs 24 are embedded into the interlayer dielectric film 21, and thereafter, a metal wiring is formed.

As described above, in this preferred embodiment, in the selecting gate transistor ST of the memory cell, the first-layer gate electrode material film L1 is used as the lowermost layer of the gate electrode 8, and the second-layer gate electrode material film L2 and the third-layer gate electrode material film L3 are stacked on the first-layer gate electrode material film L1 via the interlayer dielectric film 5. In addition, the third-layer gate electrode material film L3 contacts the first-layer gate electrode material film L1 at a predetermined place to be used as the uppermost layer of the gate electrode 8. Therefore, as shown in FIG. 3, the metal wiring 26 connected to the selecting gate line SG contacts the gate electrode 8 having the three-layer structure. As a result, the contact of the metal wiring 26 does not go through the gate electrode 8 unlike the prior art using only the first-layer gate electrode material film.

In addition, the control gate 6 of the memory transistor MT is formed of the laminated film of the second-layer and third-layer gate electrode material films L2 and L3, and similarly, the gate electrode 12 of the peripheral circuit transistor Q is also formed of the laminated film of the second-layer and third-layer gate electrode material films L2 and L3. Therefore, if the first-layer gate electrode material film L1 serving as the floating gate 4 of the memory transistor MT is thinned, the difference between the levels of the memory transistor MT portion and the peripheral circuit transistor Q portion is small. Thus, it is possible to easily carry out the planarization of the interlayer dielectric film 21 by the CMP before forming the metal wiring.

(Second Preferred Embodiment)

In the above described preferred embodiment, in the gate electrode 8 of the selecting gate transistor ST, the third-layer gate electrode material film L3 is used as a backing gate wiring by bringing the third-layer gate electrode material film L3 into contact with the first-layer gate electrode material film L1 on the element isolating region. That is, the contact opening 9 of the third-layer gate electrode material film L3 to the first-layer gate electrode material film L1 is discontinuously arranged. However, this contact opening 9 may be continuously formed along the selecting gate line SG.

Figure 10:
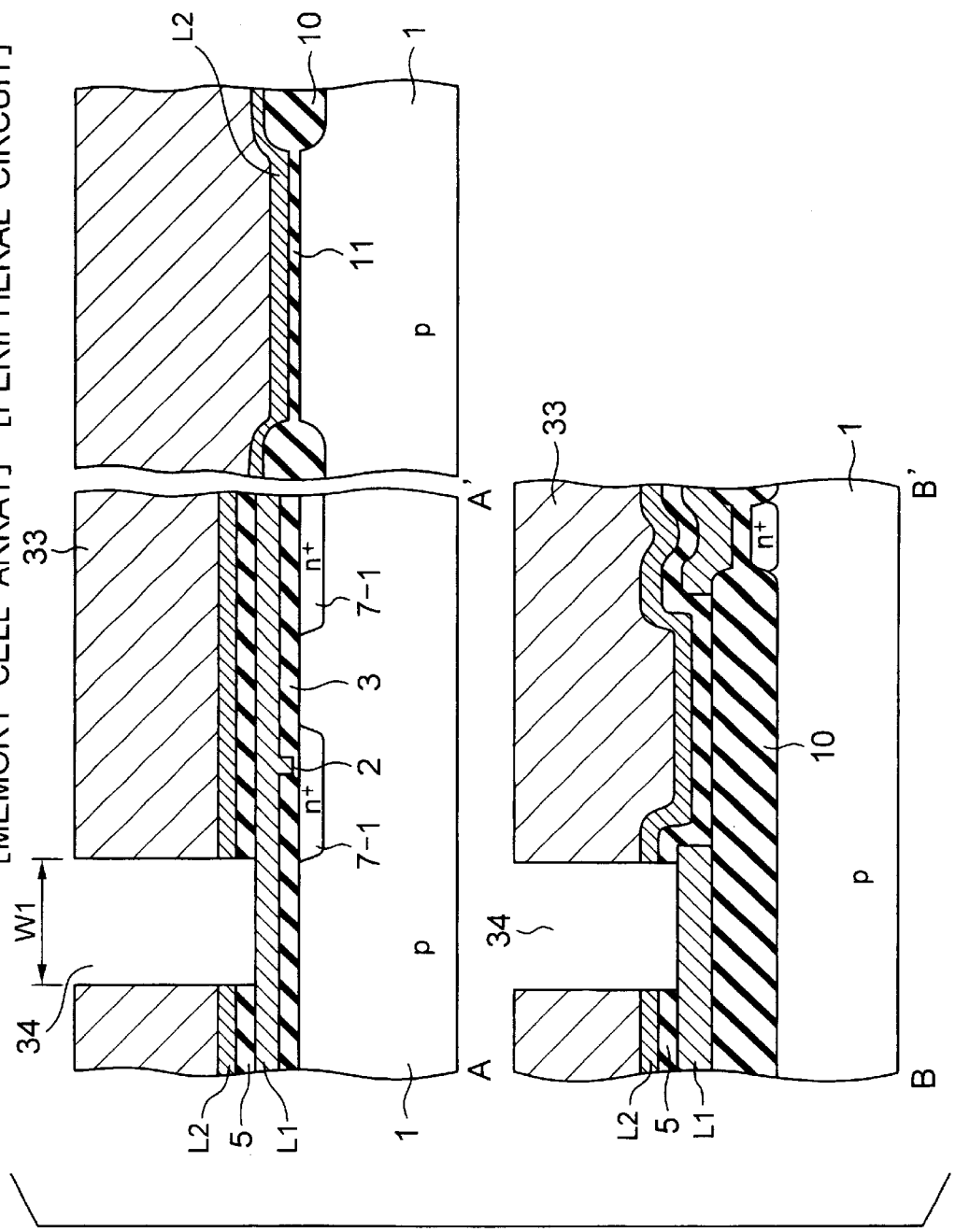
FIG. 10 is a sectional view in another preferred embodiment, which corresponds to FIG. 7.
Figure 11:
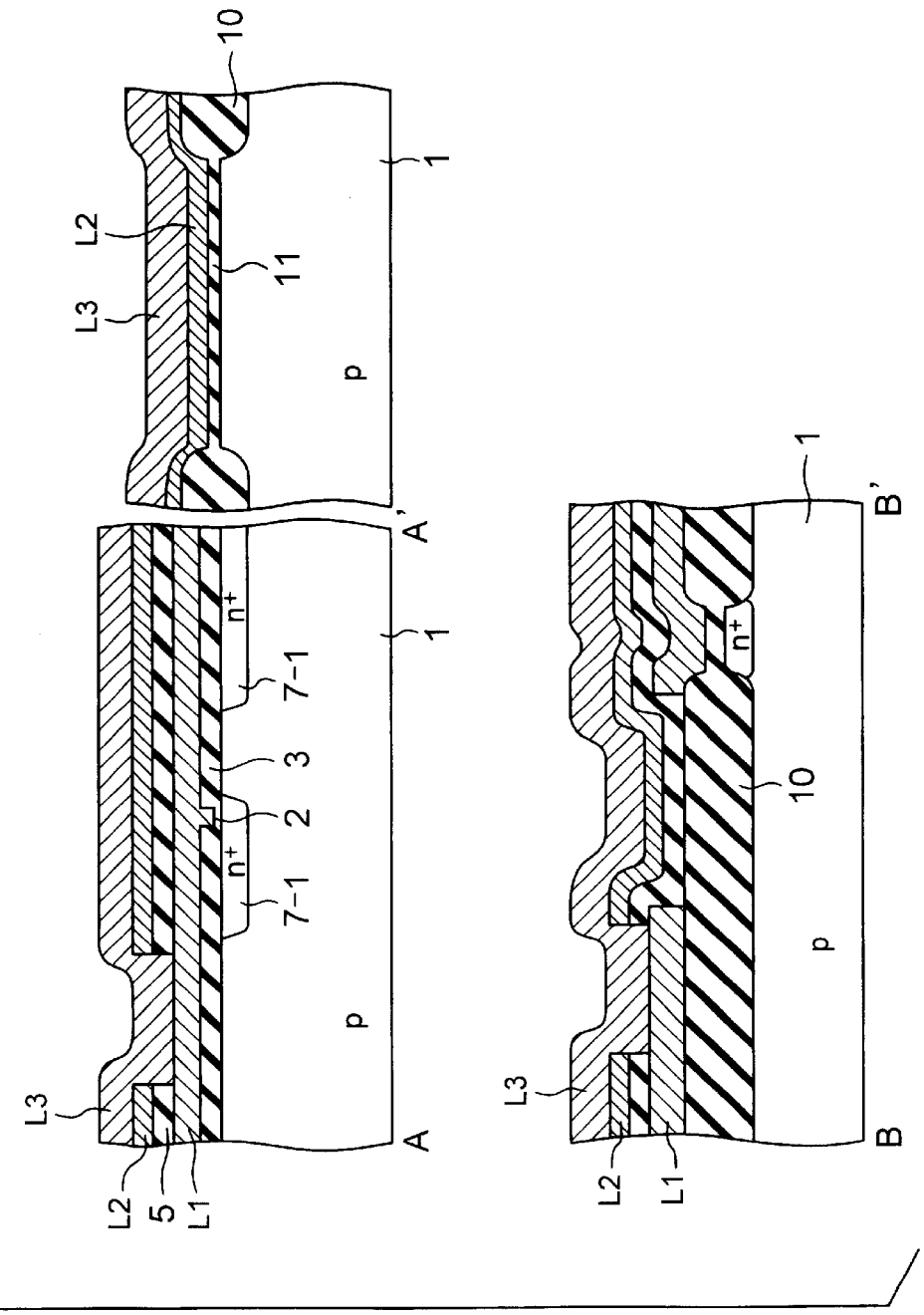
FIG. 11 is a sectional view in this preferred embodiment, which corresponds to FIG. 8.
Figure 12:
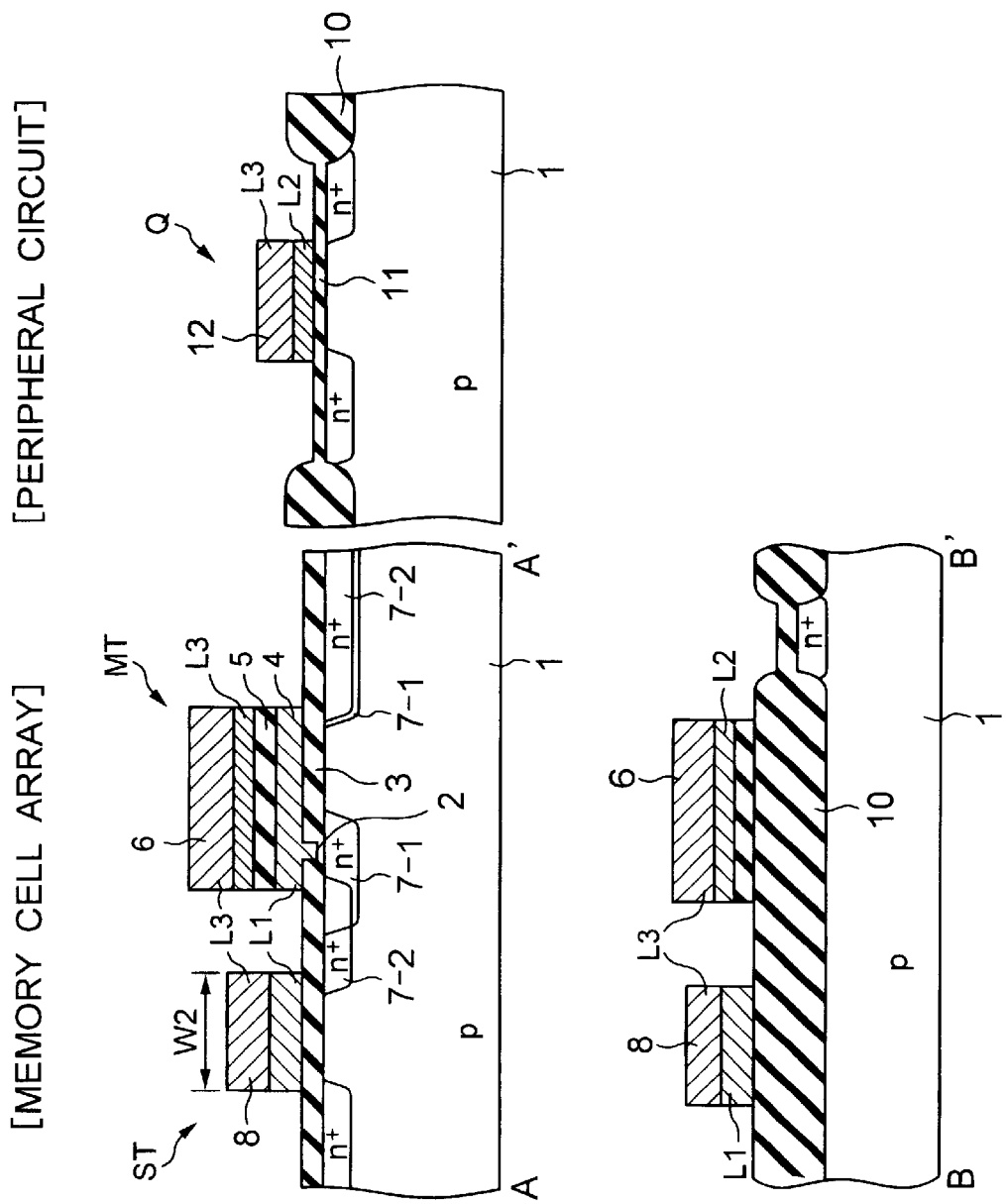
FIG. 12 is a sectional view in this preferred embodiment, which corresponds to FIG. 9.

Then, a producing process in such a preferred embodiment will be described. The steps shown in FIGS. 4 through 6 are the same as those in this preferred embodiment. The sectional views of steps corresponding to those of FIGS. 7 and 8 are shown in FIGS. 10 through 12. As shown in FIG. 10, the resist pattern 33 is formed so as to have a slit 34 which continuously extends along the selecting gate line SG. The width W1 of the slit 34 may be wider than the width W2 of the finally processed selecting gate line SG.

Then, the resist pattern 33 is used for etching the second-layer gate electrode material film L2 and the interlayer dielectric film 5 to form a slit-like opening 9 which is wider than the width W2 of the selecting gate line SG.

Thereafter, the resist pattern 33 is removed to deposit the third-layer gate electrode material film L3 (FIG. 11) similar to the preceding preferred embodiment, and thereafter, the gate electrode is processed (FIG. 12). If the width W2 of the gate electrode 8 of the selecting gate transistor ST is set to be less than the width W1 of the slit opening 9 which is formed in the interlayer dielectric film 5, the gate electrode 8 of the selecting gate transistor ST is formed of the laminated film comprising the first-layer gate electrode material film L1 and the third-layer gate electrode material film L3, the whole surfaces of which contact each other without the need of the interlayer dielectric film provided therebetween, as shown in FIG. 12.

Figure 13:
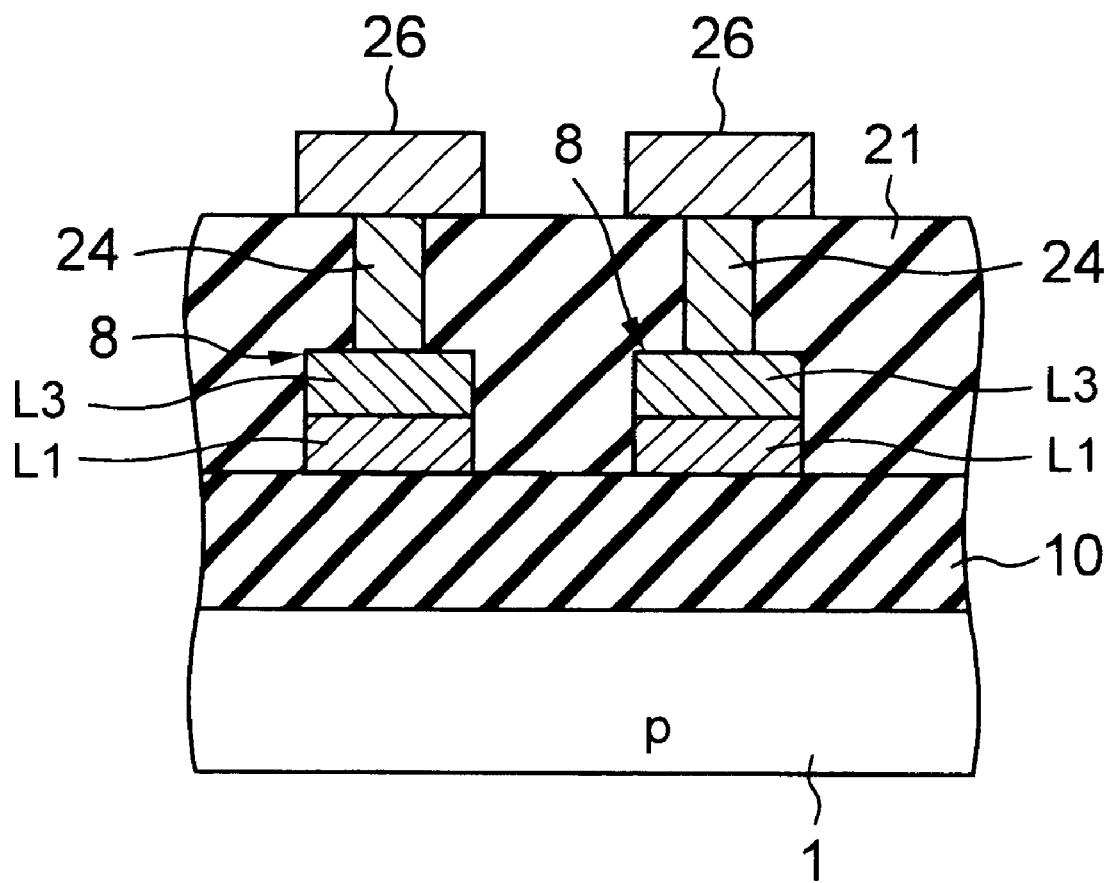
FIG. 13 is a sectional view in this preferred embodiment, which corresponds to FIG. 3.

The structure of the contact portion of the metal wiring 26 to the selecting gate line SG in this preferred embodiment is shown in FIG. 13 which corresponds to FIG. 3. Since the contact of the metal wiring 26 is formed in the laminated film of the first-layer gate electrode material film L1 and the third-layer gate electrode material film L3, the contact of the metal wiring 26 does not go through the gate electrode similar to the first preferred embodiment.

In addition, according to this preferred embodiment, in the gate electrode of the selecting gate transistor ST, i.e., in the selecting gate line SG, the third-layer gate electrode material film L3 is not mere a backing for the first-layer gate electrode material film L1, and the first-layer gate electrode material film L1 and the third-layer gate electrode material film L3 are integrally stacked, so that the gate electrode 8 and the selecting gate line SG have a lower resistance.

As described above, according to the present invention, the gate electrode of the selecting gate transistor is formed by patterning the first-layer gate electrode material film and the third-layer gate electrode material film contacting therewith. Therefore, it is possible to surely prevent the contact from going through the gate electrode at a step of bringing the metal wiring into contact with the gate electrode of the selecting gate transistor, so that it is possible to improve yields and reliability.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising a memory cell array having arranged memory transistors and selecting gate transistors of nonvolatile memory cells, each said memory transistor and each said selecting gate transistor having a first-layer gate electrode material film which is formed on a semiconductor substrate via a gate insulating film, and second-layer and third-layer gate electrode material films which are stacked on said first-layer gate electrode material film via an interlayer dielectric film, each said memory transistor having a floating gate which is formed of said first-layer electrode material film, and a control gate which is formed of a laminated film of said second-layer and third-layer gate electrode material films, and each said selecting gate transistor having a gate electrode which is formed of said first-layer to third-layer electrode material films while said third-layer gate electrode material film contacts said first-layer gate electrode material film via an opening which is formed in said second-layer gate electrode material film and said interlayer insulating film.

2. A semiconductor memory device as set forth in claim 1, wherein said control gates of said memory transistors are patterned unitedly as a control gate line, said memory cells being continuously arranged in one direction, and said gate electrodes of said selecting gate transistors are patterned unitedly as a selecting gate line, said selecting gate transistors being continuously arranged in one direction.

3. A semiconductor memory device as set forth in claim 1, wherein said gate insulating film of said memory transistors has tunnel insulating film portions which are formed by windows.

4. A semiconductor memory device as set forth in claim 1, which further comprises a peripheral circuit integrated with said memory cell array on said semiconductor substrate, said peripheral circuit having transistors each of which is formed by patterning said laminated film of said second-layer and third-layer gate electrode material films, said laminated film being formed on said semiconductor substrate via said gate insulating film.

5. A semiconductor memory device as set forth in claim 1, wherein said second-layer gate electrode material film is thinner than said third-layer gate electrode material film.

* * * * *